United States Patent [19]
Seddick

[11] 3,992,663
[45] Nov. 16, 1976

[54] PROCESS AND APPARATUS FOR LOCATING SHORT-CIRCUITS IN MULTI-LAYER CIRCUIT BOARDS

[75] Inventor: Peter Seddick, Gauting, Germany

[73] Assignee: Siemens Aktiengesellschaft, Berlin and Munich, Germany

[22] Filed: Feb. 7, 1974

[21] Appl. No.: 440,280

[30] Foreign Application Priority Data
Mar. 9, 1973  Germany.............................. 2311903

[52] U.S. Cl.............................. 324/52; 324/73 PC
[51] Int. Cl.².......................................... G01R 31/08
[58] Field of Search............. 324/52, 73 PC, 158 P, 324/37

[56] References Cited
UNITED STATES PATENTS

| | | | |
|---|---|---|---|
| 3,247,453 | 4/1966 | Quittner................................. | 324/37 |
| 3,274,489 | 9/1966 | Behr..................................... | 324/52 |
| 3,303,400 | 2/1967 | Allison........................... | 324/52 UX |
| 3,441,842 | 4/1969 | Sturm.................................... | 324/52 |
| 3,621,384 | 11/1971 | Yamada................................. | 324/52 |
| 3,725,779 | 4/1973 | Mauer................................... | 324/51 |

*Primary Examiner*—Gerard R. Strecker
*Attorney, Agent, or Firm*—Hill, Gross, Simpson, Van Santen, Steadman, Chiara & Simpson

[57] ABSTRACT

Method and apparatus for locating shot-circuis in multi-layer circuit boards which comprise applying a detectable signal between conductors on the circuit boards which should be insulated from each other and utilizing a movable probe capable of detecting the detectable signal which exists between the conductors when a fault such as a short circuit exists between them. By moving the probe over various areas of the circuit boards, the particular physical location of the fault can be determined. The probe may be manually moved or moved with a scanning mechanism.

4 Claims, 3 Drawing Figures

PROCESS AND APPARATUS FOR LOCATING SHORT-CIRCUITS IN MULTI-LAYER CIRCUIT BOARDS

BACKGROUND OF THE INVENTION

1. Field of the Invention

This invention relates in general to apparatus and method for locating short-circuits in multi-layer circuit boards.

2. Description of the Prior Art

In large electrical devices, a number of individual component assemblies are provided in which permanent circuit paths are provided on copper-clad insulated boards which are stacked together and connected by plated-through contacts which extend from one board to the others. Multi-layer circuit boards of this type include boards comprised solely of conductor paths for series or shunt electrical connections and of those which provide earth paths or voltages on the entire surfaces. Such conductor paths are produced by etching the film so as to provide the desired conductor path for the circuits and for the ground and voltage planes and through contacts are connected at selected points to interconnect the circuits on the boards.

In order to assure that the assembled multi-layer package does not become too thick since multi-layers having up to 30 layers are used, the individual layers are formed from thin copper-clad foils which might be approximately 0.2 mm. Electrical faults which are observable which occur in the production of the multi-layer circuits such as etching bridges and breaks in the conductor paths exist as well as additional faults which arise during the connecting together of the individual multi-layer levels. Thus, in the process of stacking and bonding the various boards together, faults can result due to the fact that a layer may become distorted such that undesired connections may take place during the installation of the through contacts. It is also possible for undesirable short-circuit connections to be caused by splashes of tin during surge soldering.

It is therefore imperative that multi-layer circuit boards be checked for possible faults; and in large production quantities of stack circuits, computers can be used for this purpose. However, at times, small production quantities are produced of stacked boards, as for example, when customers ask for samples in small quantities for experimental or test runs and the use of computers for testing such small quantity production boards is too expensive. Thus, for testing small quantities of stack boards checks of random specimens might be made and faults in the boards may not be noticed until the boards are installed in the operating apparatus.

The cost of producing small numbers of multi-layer boards is much more expensive than the cost of individual boards made in production quantities and often times spare units are not made in sample quantities and it is difficult to repair the faulty unit. When a discontinuity exists in conductor paths which should be electrically connected, it is possible to bridge the discontinuities with a wire conductor and thus eliminate the circuit interruption. However, short-circuits occur more frequently; and it is much more difficult to eliminate short-circuits particularly due to the fact that short-circuits may occur at internal locations in the stacked assembly of the boards and the location of the short-circuit cannot be visually observed from the exterior of the component. A crude method of eliminating short-circuits exists wherein a surge of current is applied to the shorted leads, however, by burning the short-circuit out in this manner leads to distruction of the multi-layer unit because the gases which are formed due to the burn-out current cause the multi-layer circuit board to be inflated.

SUMMARY OF THE INVENTION

It is an object of the present invention to provide a simple and inexpensive method of locating short-circuits in multi-layer circuit boards. The present invention provides for the furnishing of an alternating voltage between a pair of conductors on the circuit board which should under normal conditions be insulated from each other. In the event a short-circuit exists between these conductors, the alternating voltage will cause current to flow between the conductors and a magnetic probe is utilized to locate the path of the current through the circuit board structure. The magnetic probe can detect the magnetic field caused by the current. The magnetic probe is connected to an amplifier and loud speaker which reproduces an audio tone based on the frequency of the alternating voltage which is applied to the circuit.

Another feature of the invention is that a probe of relatively large size may be used to determine roughly the position of the short-circuit and subsequently a probe having a relatively fine point can be used precisely to detect the position of a short-circuit.

Other objects, features and advantages of the invention will be readily apparent from the following description of certain preferred embodiments thereof, taken in conjunction with the accompanying drawings, although variations and modifications may be effected without departing from the spirit and scope of the novel concept of the disclosure, and in which:

DESCRIPTION OF THE PREFERRED EMBODIMENTS

Figure 1:
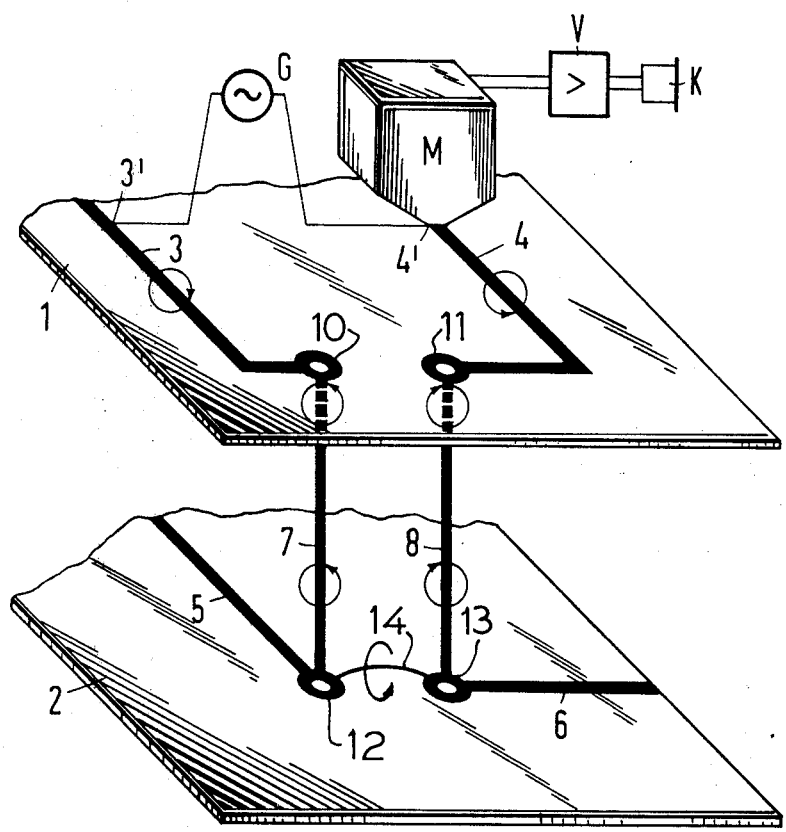
FIG. 1 is an exploded view of a multi-layer composite printed circuit arrangement.

FIG. 1 illustrates a first printed circuit board 1 which has foil conductors 3 and 4 on a first surface thereof and which is stacked with a plurality of other boards such as board 2 which has conductors 5 and 6 attached thereto. An angular portion 10 of conductor 3 is formed on board 1 in a standard reference position so as to be aligned with angular portions 12 formed on the other boards such as the board 2 and which are connected, as for example, to the conductor 5. Likewise, an angular foil portion 11 is connected to the conductor 4 in alignment with an angular foil portion 13 which is connected to the foil portion 6. Vertical through hole conductor 7 extends between the angular foil portion 10 and angular foil portion 12. The conductor 8 extends between the angular portion 11 and the angular portion 13. It is to be realized that the plurality of boards such as 1 and 2 are stacked such that the through conductors 7 and 8 align with selected ones of the conductors on the boards which are to be electrically connected together.

Assume that an undesirable short exists between the angular foil portion 12 and the angular foil portion 13 which is indicated by the conductor 14.

A generator G is connected to points 3' and 4', respectively, connected to conductors 3 and 4 and supplies an alternating voltage to the conductors 3 and 4.

A magnetic head M which may be of the type used in a magnetic sound recording device is connected to a low frequency amplifier V which has an output connected to a headphone K which might be, for example, an electro-acoustic transducer.

The generator G may produce an output frequency of about 600 Hz which is in the audio range; and in the event the short-circuit 14 exists between the conductors 3 and 4, as shown in FIG. 1, the magnetic head M will detect the magnetic field surrounding the current carriers and will supply 600 Hz signal to the amplifier V which can be heard by the operator with the headphones K. The generator G may provide a pulse or sine wave which provides a current of about 50 mA at a frequency of 600 Hz.

The magnetic head might have a width of approximately 30 um, and the current path can be traced by moving the probe so that the maximum loudness of the output tone is detected. Since the operator knows that the conductors 3 and 4 should not be electrically connected, he can determine if he moves the head M between the angular foil portion 11 and the angular foil portion 10 that if an audio signal is detected as he moves between these points that a short-circuit exists in one of the layers between these points.

It is possible to interrupt the short-circuit 14 if it exists in one of the boards between the conductors 7 and 8 by drilling vertical holes through all of the boards until such short 14 is interrupted.

The short-circuit may also be isolated by boring one or more of the plurality of through contacts 7 and 8, and if this removes the short-circuit, the through contact can be replaced by a wire after the drilling has been completed.

Figure 2:
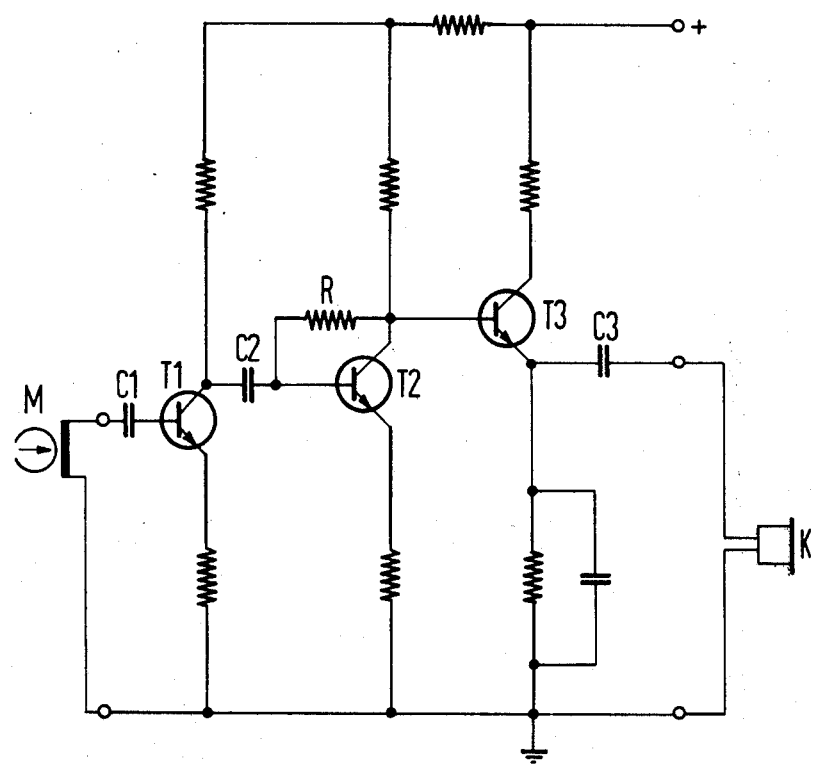
FIG. 2 is a schematic illustrating the amplifier for use with a magnetic head probe.

FIG. 2 illustrates the amplifier V which receives an input from the magnetic head M which is coupled to the base of a first transistor T1 through the capacitor C1. The collector of transistor T1 is coupled through a capacitor C2 to the base of a second transistor T2. The collector of transistor T2 is connected to the base of a transistor T3 which has its emitter connected through a condenser C3 to the earphone K. The other terminal of the earphone K is connected to ground. The emitters of transistors T1, T2, and T3 are connected to ground through resistors and the collectors of T1, T2, and T3 are connected to a suitable positive bias source through biasing resistors.

A negative feedback resistor R is connected between the collector and base of the transistor T2. It is to be realized that the voltage biasing resistors are conventional in the collector and emitter circuits of the transistors.

Figure 3:
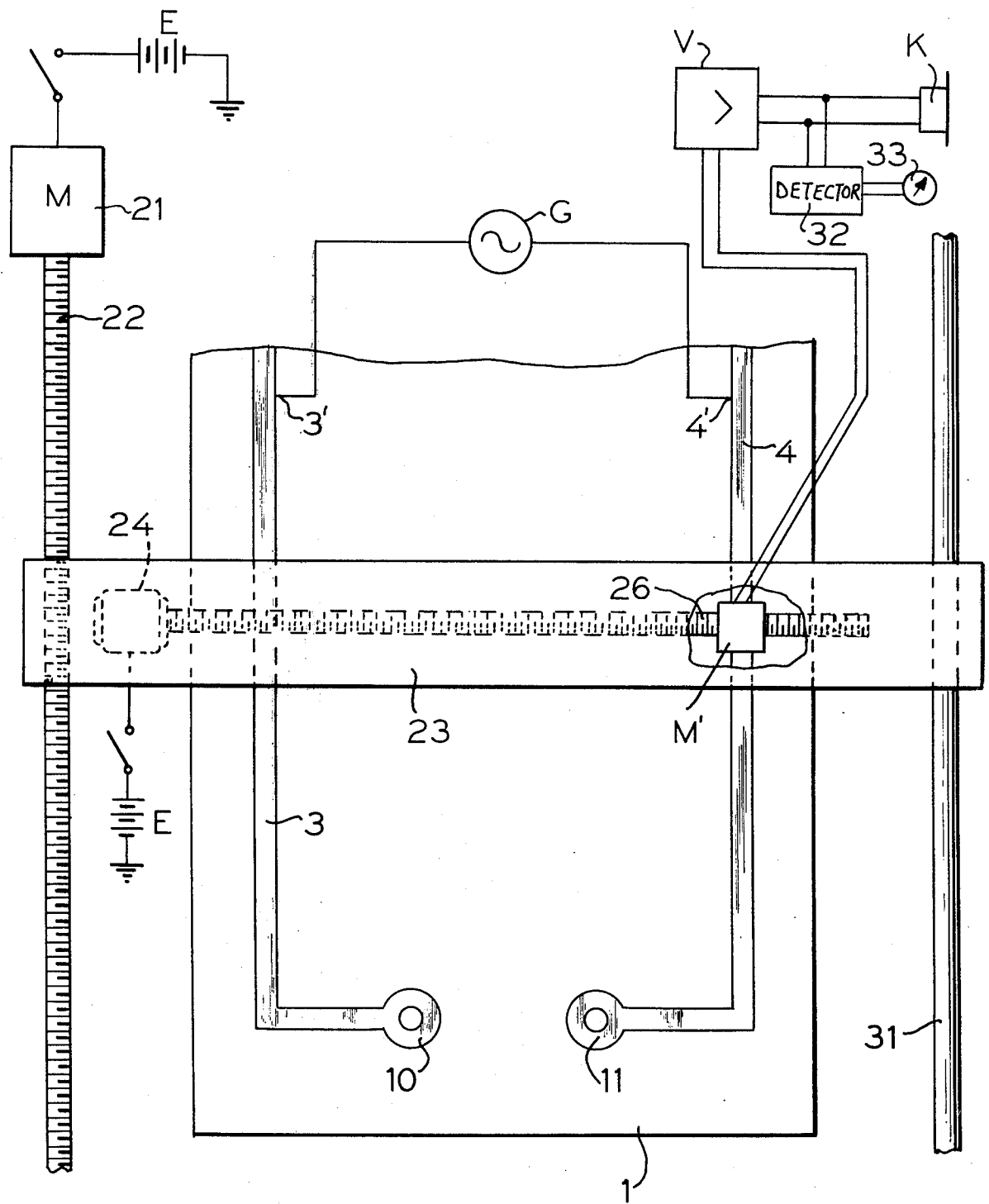
FIG. 3 illustrates a modification of the invention wherein the probe is scanned relative to the printed circuit board.

FIG. 3 illustrates a modification of the invention wherein the probe M' is a smaller probe which allows more precise detection of the magnetic field in the assembly and also wherein the probe M' is mechanically scanned by a first motor 21 which drives a lead screw 22 to move a carriage 23 which is threadedily driven by the lead screw 22. The carriage 22 carries the magnetic head M' and thus as the motor 21 is energized the magnetic head will be moved vertically relative to the FIG. 3 over the board assembly. The carriage 23 is provided with a transverse scanning motor 24 which is connected to a lead screw 26 for moving the magnetic head M' transversely of the boards 1 and 2. Thus by scanning the magnetic head over different portions of the boards 1 and 2, the maximum audio signal can be noted and the magnetic field caused by the currents from the generator G will be detected.

A guide 31 engages the opposite side of carriage 23.

A detector 32 is connected to the output of amplifier V and supplies an output to meter 33 where the detected signal is indicated.

It is seen that this invention provides a method and apparatus for detecting faults in stacked printed circuit boards, and although it has been described with respect to preferred embodiments, it is not to be so limited as changes and modifications may be made therein which are within the full intended scope as defined by the appended claims.

I claim as my invention:

1. A device for detecting short circuits on multiconductor stacked boards comprising, an alternating source comprising a sine wave or pulse generator which has an output frequency of less than one kHz connected to a pair of said multiconductors which are intended to be insulated from each other, a magnetic head detector probe moveable over a surface of one of said stacked boards to detect the path of current flow between said pair of multiconductors, an alternating current amplifier connected to said magnetic probe, an indicator connected to said amplifier to indicate the flow of current between said pair of multiconductors such that the location of short circuits can be determined, and mechanical scanning means connected to said magnetic head detector probe for moving it longitudinally and laterally over a surface of said stacked boards.

2. A device according to claim 1, wherein said alternating voltage source has an output frequency of about 600 Hz.

3. A device according to claim 1, wherein said indicator is an electro-acoustic transducer.

4. A device according to claim 3, wherein said electro-acoustic transducer is a headphone.

* * * * *